United States Patent
Kobayashi (10) Patent No.: US 9,117,980 B2
(45) Date of Patent: Aug. 25, 2015

(54) LIGHT-EMITTING DEVICE INCLUDING SEALING UNITS WITH DIFFERENT PHOSPHOR CONCENTRATIONS

(75) Inventor: Mitsuhiro Kobayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 284 days.

(21) Appl. No.: 13/601,256

(22) Filed: Aug. 31, 2012

(65) Prior Publication Data

US 2013/0193839 A1    Aug. 1, 2013

(30) Foreign Application Priority Data

Jan. 27, 2012   (JP) ................................ 2012-015536

(51) Int. Cl.
  *H05B 33/04* (2006.01)
  *H01L 33/50* (2010.01)

(52) U.S. Cl.
  CPC ............. *H01L 33/504* (2013.01); *H01L 33/505* (2013.01); *H01L 33/507* (2013.01); *H01L 2224/32245* (2013.01); *H01L 2224/48091* (2013.01); *H01L 2224/48247* (2013.01); *H01L 2224/48471* (2013.01); *H01L 2224/73265* (2013.01)

(58) Field of Classification Search
  CPC .... H01L 33/508; H01L 33/505; H01L 33/504
  USPC ...................... 313/502–503, 512; 257/98, 100
  See application file for complete search history.

(56) References Cited

U.S. PATENT DOCUMENTS

| 7,539,223 | B2 * | 5/2009 | Tokunaga | ........................ 372/23 |
| 2009/0039762 | A1 * | 2/2009 | Park et al. | ..................... 313/502 |
| 2013/0020610 | A1 * | 1/2013 | Katayama | ..................... 257/100 |

FOREIGN PATENT DOCUMENTS

| JP | 2005-093896 | 4/2005 |
| JP | 2005-294646 | 10/2005 |
| JP | 2009-231569 | 10/2009 |
| JP | 2010-103349 | 5/2010 |
| JP | 2010-123802 | 6/2010 |

* cited by examiner

*Primary Examiner* — Karabi Guharay
(74) *Attorney, Agent, or Firm* — Patterson & Sheridan, LLP (57) ABSTRACT

A light-emitting device includes a light-emitting element, a first sealing unit that covers the light-emitting element and includes a light-transmissive resin, and a second sealing unit disposed on top of the first sealing unit and includes a light-transmissive resin. The light-transmissive resin of the first and second sealing units contain phosphor of the same type but at different levels of concentration.

9 Claims, 5 Drawing Sheets

Fig. 6

LIGHT-EMITTING DEVICE INCLUDING SEALING UNITS WITH DIFFERENT PHOSPHOR CONCENTRATIONS

CROSS-REFERENCE TO RELATED APPLICATION

This application is based upon and claims the benefit of priority from Japanese Patent Application No. 2012-015536, filed Jan. 27, 2012; the entire contents of which are incorporated herein by reference.

FIELD

Embodiments described herein relate generally to a light-emitting device.

BACKGROUND

A light-emitting device that is equipped with LED (Light Emitting Diode) has shown problems in that the color shades of the light produced thereby differs according to the viewing angles. For example, when such a device is attached to a lighting equipment, there is a variation in the visible color depending on the viewing angles. Such a problem can often occur due to various factors in manufacturing methods and structures of the light-emitting device equipped with the LED on a substrate, and the like.

In one example, the light-emitting device is equipped with light-emitting elements on the bottom of the reflection pane. This light-emitting device that is equipped with the reflection pane has the problem of a narrow light distribution angle. Accordingly, there is a need for a light-emitting device that is capable of widening the light distribution angle, and suppressing the variation in the color based on the emission angle.

DETAILED DESCRIPTION

In general, embodiments are described with reference to the drawings. In the drawings, like elements are denoted by the same reference numerals and detailed descriptions are omitted accordingly. Also, X, Y, and Z in each drawing represent the three directions orthogonal to one another. For example, X and Y directions are parallel to the main surface of a base surface 2 shown in FIG. 1; Z direction is perpendicular to the main surface of the base surface 2. Also, an uppermost position of a device in the Z direction is referred to as the top, and a lowermost position of the device in the Z direction is referred to as the bottom.

A light-emitting device according to an embodiment controls the variation of the colors that are created by different light beam angles and also widens the light distribution angles.

A light-emitting device according to the embodiment includes a light-emitting element, a first sealing unit that has a light transmissive resin and phosphor at a first level of concentration, and covers the light-emitting element, and a second sealing unit that has a light-transmissive resin, and phosphor at a second level of higher concentration, which is higher than that of the first level of concentration, and is provided over the first sealing unit. The sides of the first and second sealing units that cross a boundary surface between the first and second sealing units are exposed.

Furthermore, the phosphor included in the second sealing unit fluoresces to product light with the same wavelength as the phosphor included in the first sealing unit.

In a further embodiment, the first sealing unit has multiple types of phosphors, and the same types of phosphors are included in the second sealing unit.

Also, the boundary surface may be pear-grounded.

In addition, the first and second sealing units may be in the form of a quadrangular prism.

Figure 1:
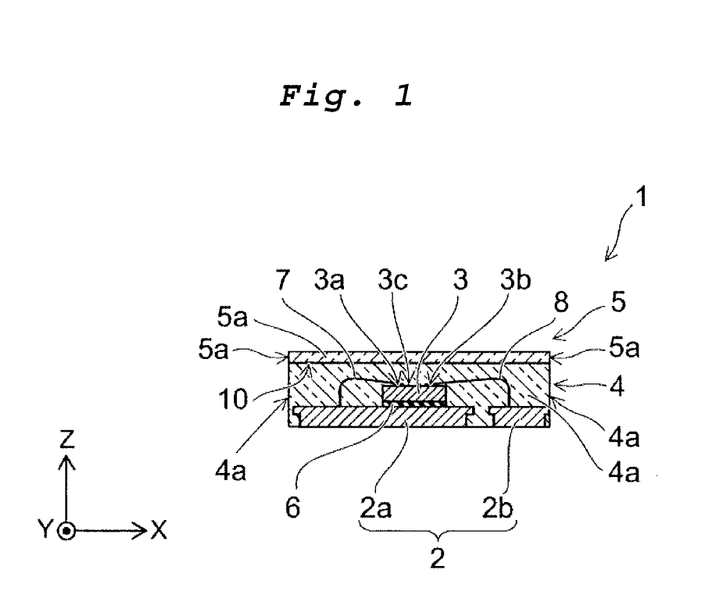
FIG. 1 is a schematic cross-sectional view of a light-emitting device according to an embodiment.

FIG. 1 is a schematic cross-sectional view to show the light-emitting device according to the embodiment.

As shown in FIG. 1, a light-emitting device 1 includes a base surface 2, a light-emitting element 3, a sealing unit 4 (sometimes referred to herein as a first sealing unit), and a sealing unit 5 (sometimes referred to herein as a second sealing unit).

The base surface 2 includes a pair of base bodies 2a and 2b. The base bodies 2a and 2b are board-shaped and placed on the same surface. Also, the base bodies 2a and 2b are isolated from each other. The base bodies 2a and 2b are made of electrically conductive materials. For example, they may be lead frames that are constructed from a copper board. The base surface 2 may be a printed circuit board.

The light-emitting element 3, for example, may be an LED and made by laminating a semiconductor layer doped to be p-type (a p-type semiconductor), a light-emitting layer, and a semiconductor layer doped to be n-type (an n-type semiconductor).

The light-emitting element 3, for example, may be a blue LED that emits blue light. In such a case, the semiconductors may be nitride semiconductors such as GaN, AlN, AlGaN and InGaN. A luminescent layer, in such a case, includes an InGaN well layer that generates light by combining holes and electrons and a GaN barrier layer that includes band gaps that are bigger than the well layer to configure the quantum well structure.

FIG. 1 shows a case where one light-emitting element 3 is set in the center of the light-emitting device 1. However, the number or arrangement of light-emitting elements 3 is not necessarily restricted to one. For instance, multiple light-emitting elements 3 may be symmetrically placed with respect to the center axis of the light-emitting device 1.

The light-emitting element 3, for example, may be shaped in the form of a quadrangular prism, such as a cube and a rectangular solid. Also, the light-emitting element 3 is set on the main surface of the base body 2a via a joint 6. The joint 6 may be electrically conductive or insulating. The electrical conductive substance for the joint 6 may be a silver paste, solder or eutectic solder materials, for example. As for the insulating substance for the joint 6, a resin paste may be used.

Terminal 3a and terminal 3b are placed on a top 3c of the light-emitting element 3. The light-emitting element 3 is applied with a voltage between the terminals 3a and 3b, and light is illuminated from the top 3c as a light-emitting surface.

One end of wire 7 is connected to the terminal 3a of the light-emitting element 3. The other end of the wire 7 is connected to the main surface of the base body 2a. This allows the light-emitting element 3 to be electrically connected to the base body 2a via the terminal 3a and the wire 7.

One end of wire 8 is connected to the terminal 3b of the light-emitting element 3. The other end of the wire 8 is connected to the main surface of the base body 2b. This allows the light-emitting element 3 to be electrically connected to the base body 2b via the terminal 3b and the wire 8.

The wires 7 and 8 are made of a metal such as gold, copper or aluminum. The wires 7 and 8 are discussed above as electrical connecting devices, but they are not restricted to this function. For instance, just one of these wires is sufficient if a conductive substrate is employed.

The sealing unit 4 contains phosphor within a light-transmissive resin. Light-transmissive resin may be fully transmissive or partly transmissive.

In this case, the resin in the sealing unit 4 is a substance that equally distributes the phosphor contained therein. Examples of such light-transmissive resin include an epoxy resin, silicone-based resin, methacrylic resin (PMMA), polycarbonate (PC), cyclic polyolefin (COP), alicyclic acrylic (OZ), allylic diglycol carbonate (ADC), acrylic-based resin, fluorine-based resin, hybrid resin of silicone-based resin and epoxy resin, or urethane resin.

The phosphor is distributed within the light-transmissive resin. The phosphor is in granular form; it absorbs a part of the light illuminated from the light-emitting element 3 and produces fluorescence at a certain wavelength.

For instance, the phosphor absorbs a part of the blue light that is emitted from the light-emitting element 3, to produce yellow fluorescence. In this case, the sealing unit 4 emits the blue light which is not absorbed by the phosphor and the yellow light which is emitted from the phosphor.

In one embodiment, only one type of phosphor is used; in other embodiments, multiple types of phosphor may be used together.

For example, in response to the light-emitting element 3 that produces blue light, phosphors that produce only yellow fluorescence may be used. However, a phosphor that produces red fluorescence and one that produces green fluorescence may be used together to obtain the same result. In this case, the sealing unit 4 will be able to produce blue, red and green light.

The phosphor material that produces yellow fluorescence may be as shown as follows. However, it is not restricted to these chemicals, and may be different.

$Li(Eu, Sm)W_2O_8$,
$(Y, Gd)_3 (Al, Ga)_5 O_{12}:Ce^{3+}$,
$Li_2SrSiO_4: Eu^{2+}$,
$(Sr(Ca, Ba)))_3SiO_5:Eu^{2+}$,
$SrSi_2ON_{2.7}: Eu^{2+}$.

The phosphor material that produces red fluorescence may be as shown as follows. However, it is not restricted to these chemicals and may be different.

$La_2O_2S: Eu, Sm$,
$LaSi_3N_5: Eu^{2+}$,
α-sialon: $Eu^{2+}$,
$CaAlSiN_3: Eu^{2+}$,
$(SrCa)AlSiN_3: Eu^{x+}$,
$Sr_x(Si_yAl_3)_z(O_xN): Eu^{x+}$, The phosphor material that produces green fluorescence may be as shown as follows. However, it is not restricted to these chemicals and may be different.

$(Ba, Sr, Mg)O.aAl_2O_3, Mn$,
$(BrSr) SiO_4: Eu$,
α-sialon: $Yb^{2+}$,
β-sialon: $Eu^{2+}$,
$(CaSr)Si_2O_4N_7: Eu^{2+}$,
$Sr(SiAl)(ON): Ce$ The combination and the types of fluorescence color that is produced from the phosphor are not limited as above; the wavelengths of light emitted from the light-emitting element 3 may be changed based on the phosphor materials.

The sealing unit 4 may be in the shape of quadrangular prism, such as a cube and rectangular solid.

The sealing unit 4 is designed to cover the base body 2a, the base body 2b, the light-emitting element 3, the wire 7 and the wire 8.

A part of the base body 2a and a part of the base body 2b are exposed from the bottom of the sealing unit 4 (as shown in the figures, sides are defined as being in the X direction, and the Y direction). That is, the sealing unit 4 covers the light-emitting element 3, the wire 7 and the wire 8, and also covers the top and a part of the side of each of the base body 2a and base body 2b, which leaves the bottom exposed. The exposed parts of the base bodies 2a and 2b may include terminals to be electrically connected externally.

The sealing unit 5 is placed on top of the sealing unit 4. The resin and the phosphor of the sealing unit 5 may be the same as the ones that form the sealing unit 4. In this case, the phosphor in the sealing unit 5 will have the same wavelength of fluorescence as that in the sealing unit 4.

When multiple types of phosphors are included in the sealing unit 4, the same types of phosphors will be included in the sealing unit 5. For instance, if sealing unit 4 includes the phosphors that produce yellow fluorescence, the phosphors producing yellow fluorescence will be included in the sealing unit 5. Further, for instance, if the sealing unit 4 includes the phosphors that produce red or green fluorescence, the same types of phosphors will be installed in the sealing unit 5.

However, the concentration of the phosphor in the sealing unit 5 (second concentration) is selected to be higher than the concentration of the phosphor in the sealing unit 4 (first concentration). A detailed explanation about the concentration of the phosphor in each of the sealing units 4 and 5 will be provided later in the document.

The sealing unit 5 may be shaped in, for example, a quadrangular prism, such as a cube or a rectangular solid. The lengths in the X direction and Y direction of the sealing unit 5 should be the same as the lengths in the X and Y direction of the sealing unit 4. As a result, the light-emitting device 1 is shaped in a quadrangular prism, such as a cube, a rectangular solid.

If the outer shape of the light-emitting device 1 is a quadrangular prism, multiple light-emitting devices that may make up the light-emitting device 1 may be formed in a lump, for example, on top of the lead frame; then, using the blade dicing method or the like, each light-emitting device may be formed. As a result, the productivity of light-emitting device 1 will be enhanced.

In the light-emitting device 1, a bowl-shaped reflection pane is not provided, which reflects the light produced from the light-emitting element 3, traveling toward sides 4a and 5a of the sealing units 4 and 5. In other words, the side of the sealing unit 4 (side 4a) and the side of the sealing unit 5 (side 5a) in the direction intersecting a boundary surface 10 of the sealing units 4 and 5 are exposed.

Therefore, the light produced from the light-emitting element 3 and traveling toward the sides 4a and 5a of the sealing units 4 and 5 may be produced to the outside from the sides 4a and 5a. Accordingly, the angle of light distribution of the light-emitting device 1 may be widened to strengthen the color mixing properties of the light produced from the sides 4a and 5a.

The boundary surface 10 of the sealing units 4 and 5 may be pear-grounded to form an uneven surface. That is, at least one of the upper part of the sealing unit 4 and the lower part of the sealing unit 5 may be made pear-grounded. If the boundary surface 10 of the sealing units 4 and 5 is pear-grounded, it is possible to control the light produced from the light-emitting element 3 to reflect at the boundary surface 10. As a result, the lighting efficiency of the light-emitting device 1 will be enhanced. Also, in regard to the spreading effect of the light because of the pear-grounded surface, the variation in the color shades may be reduced by enhancing the color mixing properties of the light.

Figure 2A:
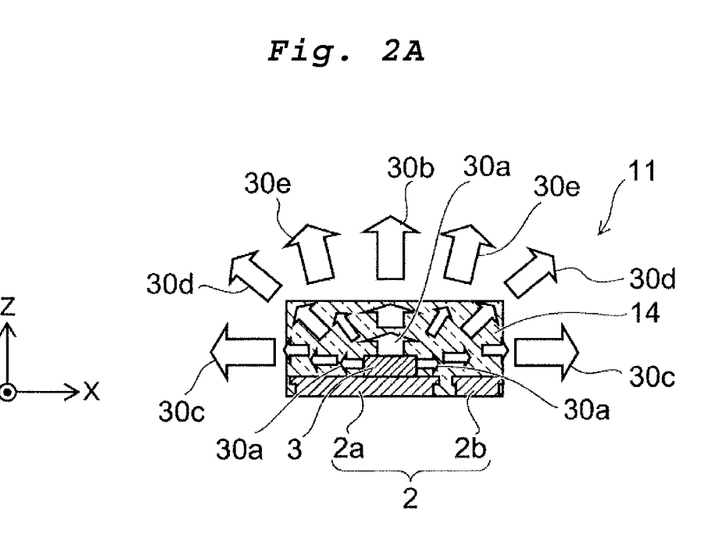
FIGS. 2A and 2B are schematic cross-sectional views that show different levels of concentrations of phosphors in a light-emitting device.
Figure 2B:
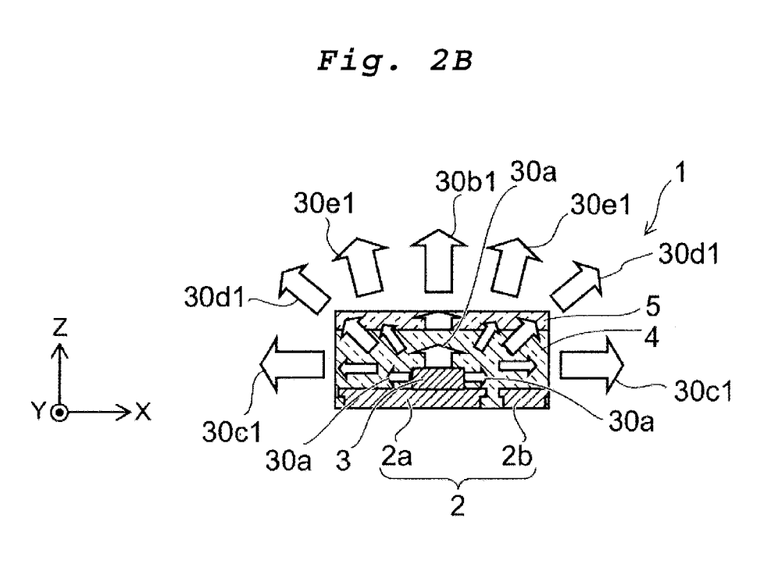

The following shows the concentration of the phosphor in the sealing units 4 and 5. FIGS. 2A and 2B show the schematic cross-sectional views that show the concentrations of the phosphors. FIG. 2A shows a light-emitting device 11 as a comparison example, while FIG. 2B shows the embodiment of the light-emitting device 1. Also, in order to avoid confusion, the wires 7 and 8 and other wiring have been omitted from the drawing.

As shown in FIG. 2A, one sealing unit 14 is placed in the comparison example of the light-emitting device 11. In this case, the transmission length of the light passing through the inside of the sealing unit 14 will be different depending on direction of the light produced from the light-emitting element 3. When the transmission length is different at the time light is transmitted through the sealing unit 14, the amount of fluorescence will also vary. For instance, if the transmission length at the time light is transmitted is longer from the inside of the sealing unit 14, the amount of phosphors that fluoresce will be higher. Therefore, the fluorescence will be brighter. As a result, the color shade will vary depending on the direction of the light emitted from the light-emitting device 11.

For example, it is assumed that the light-emitting element 3 produces blue light 30a and a phosphor which produces yellow fluorescence is included in the sealing unit 14. In this case, traveling from the light-emitting element 3 in the Z direction, the transmission length of the light 30a passing through the sealing unit 14 becomes shorter. As a result, the amount of the yellow fluorescence will become less; resulting in a close-to-blue light 30b emitted from the light-emitting device 11.

On the other hand, if the light 30a travels from the light-emitting element 3 in an X or Y direction, when it goes through the sealing unit 14, the transmission length will be longer. As a result, the amount of the yellow fluorescence produced by the phosphor will increase, and results in a close-to-yellow light 30c emitted from the light-emitting device 11.

Based on the same concept, light 30d emitted from the device 11 will be closer to yellow, but light 30e will be closer to blue.

Accordingly, as a comparison example, the light-emitting device 11 shows a large variation in the color shade of the light emitted from the light-emitting device 11.

In this case, depending on the different concentrations of the phosphor or the size of the sealing unit 14, light-emitting device 11 will affect the color shade primarily by its emission angle. Therefore, for example, if combining the light 30b that is close to the color blue and the light 30e that is seen as a yellowish blue, it is difficult to make the color of the light white.

As shown in FIG. 2B, the light-emitting device 1 according to the embodiment is provided with the sealing units 4 and 5. Blue light 30a is projected from the light-emitting element 3, and yellow fluorescence will be created with the phosphor contained in the sealing units 4 and 5. However, the concentration of the phosphor in the sealing unit 5 is made to be higher than that of the phosphor in the sealing unit 4. Compared to the concentration of the phosphor in the sealing unit 14, the concentration of the phosphor in the sealing unit 4 is lowered and the concentration of the phosphor in the sealing unit 5 is increased.

In this case, the light 30a traveling from the light-emitting element 3 in a Z direction has a shorter transmission length at the time it passes through the inside of the sealing units 4 and 5. On the other hand, the light 30a that travels from the light-emitting element 3 in an X or Y direction has a longer transmission length at the time it passes through the inside of the sealing units 4 and 5.

Accordingly, when compared with the concentration of the phosphor of the sealing unit 14, because the concentration of the phosphor in the sealing unit 4 is lowered, light 30c1 emitted to the side of the light-emitting device 1 is closer to a blue color than the light 30c.

Also, when compared with the concentration of the phosphor in the sealing unit 14, the concentration of the phosphor in the sealing unit 5 is increased. Even though the concentration of the phosphor of the sealing unit 4 is lower, light 30b1 emitted to the top side of the light-emitting device 1 may be the same color shade as the light 30b mentioned above. Similarly, the wavelength of the light 30c1 emitted to the side of the device may be made very near the wavelength of the light 30b1. In addition, the light 30d1 emitted from the light-emitting device 1 is closer to a yellow color, and light 30e1 becomes slightly yellowish blue.

In the light-emitting device 11 according to the comparison example, depending on the different concentrations of the phosphor or the size of the sealing unit 14, light-emitting device 11 will affect the color shade of the light emitted from the device primarily by its emission angle.

In contrast to the comparison example, in regard to the light-emitting device 1 according to the embodiment, depending on the concentrations of the phosphors in the sealing units 4 and 5, the color shade of the light may be adjusted with respect to the angle of the emission from the light-emitting device 1.

Figure 3A:
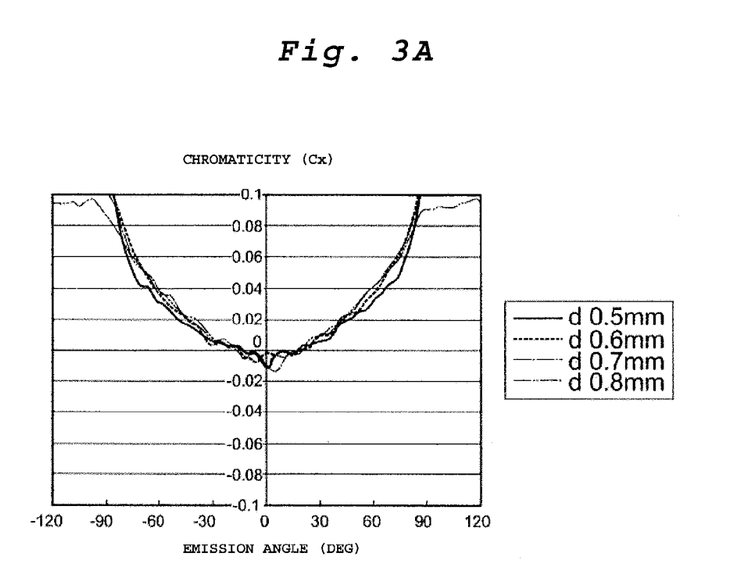
FIGS. 3A and 3B are graphs that show the variation in colors in the light emitted from the light emitting device according to a comparison example.
Figure 3B:
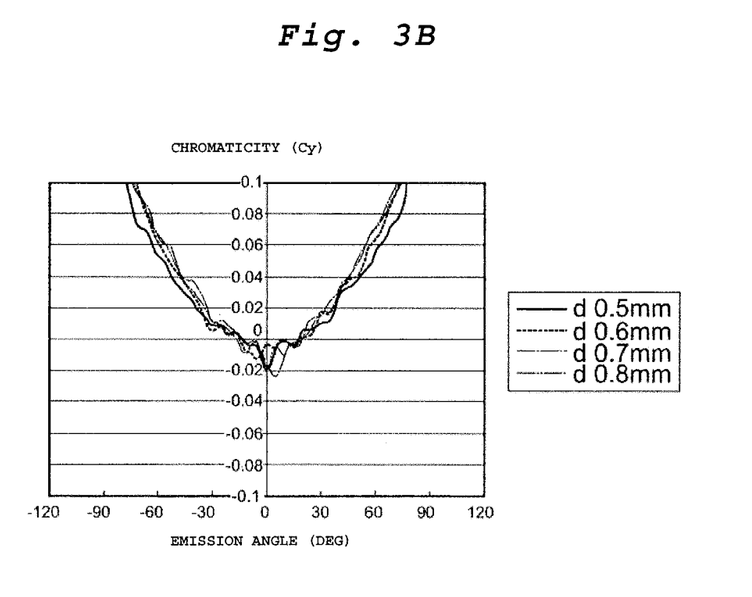

FIGS. 3A and 3B are graphs which show the light-emitting device according to a comparison example in which the color shade of the light emitted from the light-emitting device 11 varies. FIGS. 3A and 3B show a simulation analysis of the light passing through the sealing unit 14 that is emitted from the light-emitting element 3. The horizontal axis in FIGS. 3A and 3B represents the irradiation angles, 0 deg is the front side of the light-emitting device 11, 90 deg, −90 deg are the sides of the light-emitting device 11. The vertical axis in FIGS. 3A and 3B represents chromaticity; the higher part of the figure shows a more yellow color of the chromaticity, and the lower part of the figure represents a more blue color of the chromaticity. The (D) in the figure is the thickness of the sealing unit 14. The chromaticity Cx is shown in FIG. 3A while the chromaticity of Cy is shown in FIG. 3B.

Here, the differences in the chromaticity with respect to their emission angle are shown to highlight the variation of the color shades. For example, the smaller the difference between the chromaticity from 0 deg and the chromaticity from 90 deg or −90 deg, the smaller variation of the color shades is. According to FIG. 3A and FIG. 3B, the light-emitting device 11 according to the comparison example has a chromaticity difference of about 0.1 in ΔCx and above 0.1 in ΔCy. Even if the thickness d of the sealing unit 14 is changed, there is no difference in the chromaticity findings.

Figure 4A:
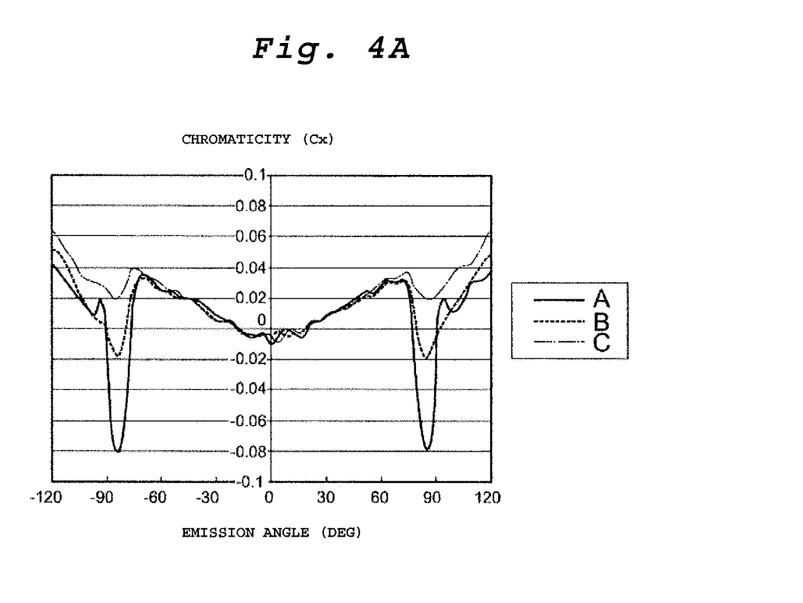
FIGS. 4A and 4B are graphs that show the variation in colors in the light emitted from a light-emitting device according to the embodiment.
Figure 4B:
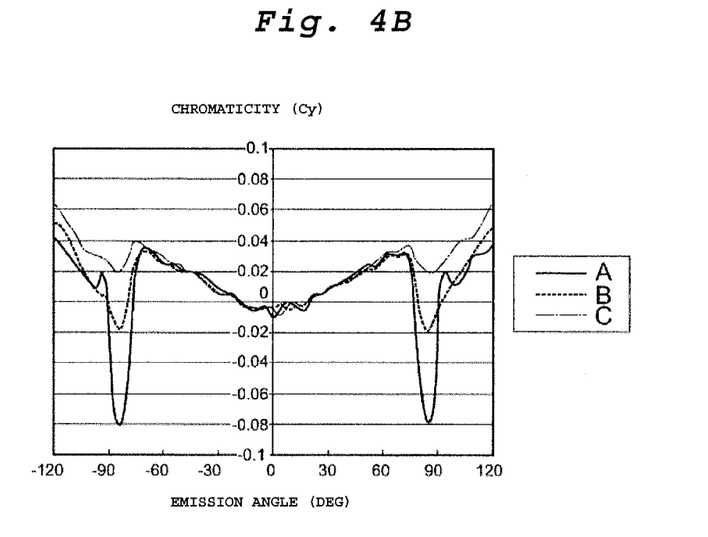

FIGS. 4A and 4B are graphs that show the variation in color shade in the light emitted from the light-emitting device 1 according to the embodiment. This is also a simulation analysis of the light passing through the sealing units 4 and 5 that is emitted from the light-emitting element 3 in FIGS. 4A and 4B. The horizontal and vertical axes represent the same things as those in FIGS. 3A and 3B. The thickness d of the sealing unit 4 is 0.4 mm, and the thickness d2 of the sealing unit 5 is 0.2 mm. Also, the concentration of the phosphor is shown by the number of the phosphor particles per unit volume.

A represents the concentration of the phosphor in the sealing unit 4 when it is 1 particle/mm$^3$, while B represents the concentration of the phosphor in the sealing unit 4 when it is 10000 particles/mm$^3$, and C represents the concentration of the phosphor in the sealing unit 4 when it is 20000 particles/mm$^3$.

The concentration of the phosphor in the sealing unit 5 is adjusted so that the chromaticity Cx satisfies Cx=0.0345. Yet, the concentration of the phosphor in the sealing unit 4 is different based on the previously mentioned differences.

FIG. 4A shows the chromaticity Cx while FIG. 4B shows the chromaticity Cy. According to FIG. 4A and FIG. 4B, the light-emitting device 1 according to the embodiment has a chromaticity difference of about 0.05 in ΔCx and about 0.07 in ΔCy. In other words, in the light-emitting device 1 according to the embodiment, because the small variation in the chromaticity may be achieved, color shade variation based on the emission angles may be suppressed.

In this case, if the concentration of the phosphor of the sealing unit 4 is too low, it becomes easier to emit blue light to the sides of the light-emitting device 1. However, this blue light is mixed with the yellowish light emitted from the side of the sealing unit 5, and the overall lighting from the side will be seen as white.

Based on this theory, by the color mixing of the light coming from the different parts of the device, white color is produced, and the variation in the color shade due to different emission angles can be controlled.

Figure 5A:
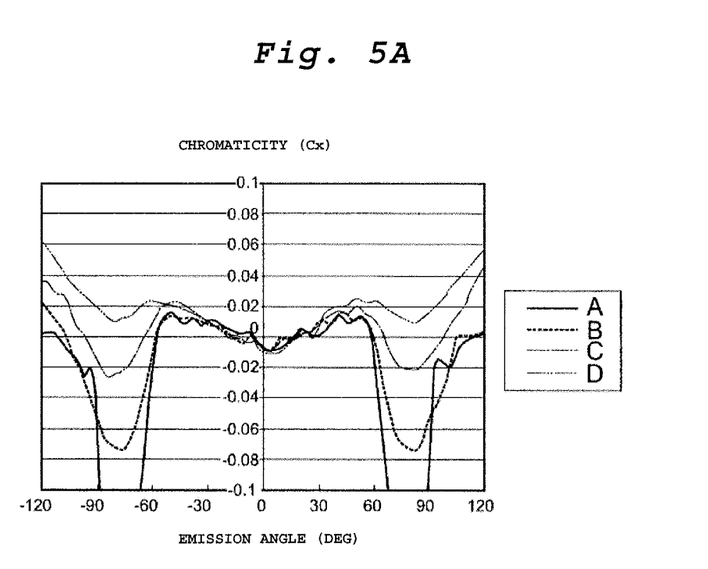
FIGS. 5A and 5B are graphs that show the variation in colors in the light emitted from a light-emitting device according to the embodiment.
Figure 5B:
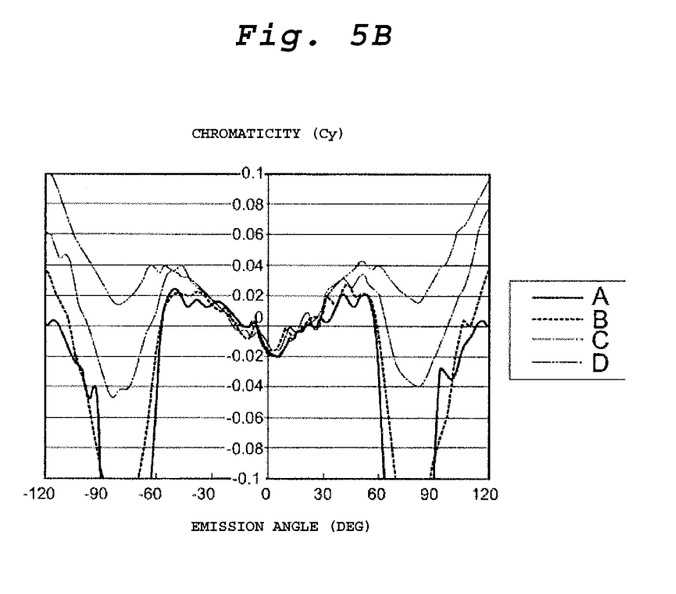

FIGS. 5A and 5B are also graphs that show the variation in color shade in the light emitted from the light-emitting device 1 according to the embodiment. This is also a simulation analysis of the light passing through the sealing units 4 and 5 that is emitted from the light-emitting element 3 in FIGS. 5A and 5B.

In the case of the device in FIGS. 5A and 5B, the package size (the surface size in the parallel direction of the top 3c of the light-emitting element 3 in the sealing units 4 and 5) is the same as the one shown in FIGS. 4A and 4B, but the thickness d1 of the sealing unit 4 is increased. In other words, the thickness d1 of the sealing unit 4 is 0.6 mm, and the thickness d2 of the sealing unit 5 is 0.2 mm.

Also, in FIGS. 5A and 5B, A represents the concentration of the phosphor in the sealing unit 4 when it is 1 particle/mm$^3$, while B represents the concentration of the phosphor in the sealing unit 4 when it is 10000 particles/mm$^3$, C represents the concentration of the phosphor in the sealing unit 4 when it is 20000 particles/mm$^3$, and D represents the concentration of the phosphor in the sealing unit 4 when it is 30000 particles/mm$^3$.

The concentration of the phosphor in the sealing unit 5 is adjusted with the chromaticity Cx so that Cx=0.0345. Yet, the concentration of the phosphor in the sealing unit 4 is different based on the previously mentioned differences.

FIG. 5A shows the chromaticity Cx while FIG. 5B shows the chromaticity Cy.

From the interpretation of FIG. 5A and FIG. 5B, even when the thickness of the sealing unit 4 is increased, the difference in the chromaticity is still small. This demonstrates that the variation of the color shade by using the different emission angles may still be controlled well.

However, when the thickness of the sealing unit 4 is increased, the blue light from the side of the light-emitting device 1 is more easily emitted. Similarly, when the concentration of the phosphor in the sealing unit 4 is increased, it may have the same effects as shown in the case in FIGS. 4A and 4B.

When the package size is set as 2.55 mm×2.15 mm, the concentration of the phosphor of the sealing unit 4 is preferably kept below 3000 particles/mm$^3$. Also, the thicknesses of the sealing unit 4 is preferably above 0.05 mm and below 0.6 mm. In addition, the thicknesses of the sealing unit 5 is preferably above 0.02 mm and below 0.2 mm. As for the concentration of the phosphor of the sealing unit 5, it should depend on the concentration of the phosphor of the sealing unit 4 and the desired chromaticity. As mentioned above, the variation of the color shade by using different emission angles may be adjusted and controlled.

Figure 6:
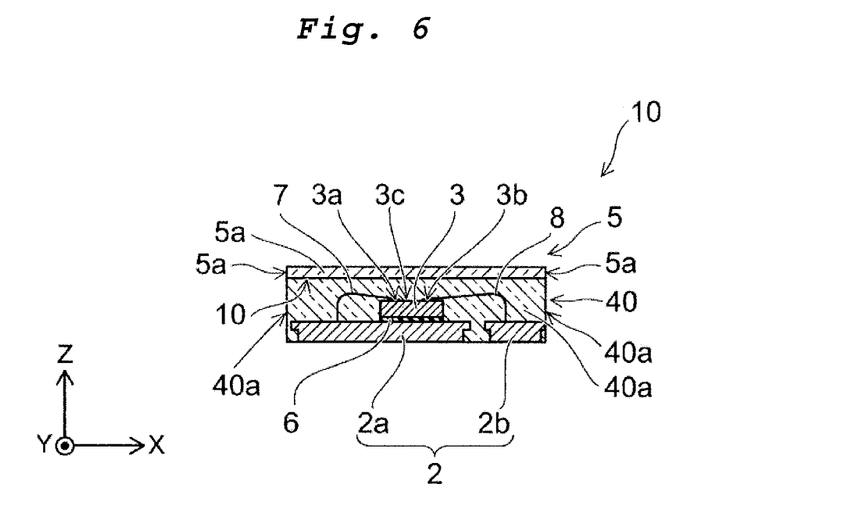
FIG. 6 is a schematic cross-sectional view of a light-emitting device of another embodiment.

FIG. 6 shows a schematic cross-sectional view to show the light-emitting device of another embodiment. As shown in FIG. 6, the light-emitting device 10 is installed with the base surface 2, the light-emitting element 3, a sealing unit 40 and the sealing unit 5.

The form of the sealing unit 40 is the same as the sealing unit 4 mentioned above. For example, a side (side 40a) of the sealing unit 40 and a side (side 5a) of the sealing unit 5 in the direction intersecting the boundary surface 10 between the sealing units 40 and 5 are exposed. Sealing unit 40 includes a light-transmissive resin of the same type as that used for the sealing unit 4, but it contains no phosphor.

Even when there is no phosphor in the sealing unit 40, the effect that is the same as shown in FIGS. 4A and 4B and 5A and 5B can obtained, because by mixing the blue light emitted from the side of the sealing unit 40 and the yellowish-blue light emitted from the top of the sealing unit 5 a white color can be formed, and the variation of the color shade due to emission angles can be reduced.

Based on the embodiment shown above, along with the possibility of widening the light distribution angle, the light-emitting device may realize the possibility of controlling the variation of the color shade of the light due to different emission angles.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting device comprising:
   a light-emitting element;
   a first sealing unit that covers the light-emitting element and includes a light-transmissive resin and phosphor; and a second sealing unit that is disposed on the first sealing unit and includes a light-transmissive resin and phosphor, wherein the first and second sealing units each include more than one type of phosphor, each type of phosphor included in the first sealing unit is included in the second sealing unit at a concentration level that is higher than a concentration level of the respective type of phosphor in the first sealing unit, and each phosphor of the same respective type produces a same wavelength of light when excited by light from the light-emitting element.

2. The light-emitting device according to claim 1, wherein sides of the first and second sealing units that cross a boundary surface between the first and second sealing units are exposed.

3. The light-emitting device according to claim 2, wherein the boundary surface is pear-grounded.

4. The light-emitting device according to claim 1, wherein each type of phosphor included in the second sealing unit is included in the first sealing unit.

5. The light-emitting device according to claim 1, wherein the first and second sealing units have a quadrangular-prism-shape.

6. The light-emitting device according to claim 1, wherein the distance from the light-emitting element to a top surface of the second sealing unit is less than one-half the distance from the light-emitting element to a side of the first sealing unit.

7. A light-emitting device comprising:
a light-emitting element;
a first sealing unit that covers the light-emitting element and contains a light-transmissive resin in which phosphor particles are distributed; and
a second sealing unit that is disposed on the first sealing unit and contains a light-transmissive resin in which phosphor particles are distributed, wherein the thickness of the first sealing unit is at least twice the thickness of the second sealing unit and the distance from the light-emitting element to a top surface of the second sealing unit is less than one-half the distance from the light-emitting element to a side of the first sealing unit, the concentration of phosphor particles in the first sealing unit is less than the concentration of phosphor particles in the second sealing unit, and all of the phosphor particles in the first and second sealing units are of a single type that produces a same wavelength of light when excited by light from the light-emitting element.

8. The light-emitting device according to claim 7, wherein a boundary surface between the first and second sealing units is pear-grounded.

9. The light-emitting device according to claim 7, wherein the first and second sealing units have a quadrangular-prism-shape.

* * * * *